US00RE44255E

(19) United States
(12) Reissued Patent
Amiotti

(10) Patent Number: US RE44,255 E
(45) Date of Reissued Patent: Jun. 4, 2013

(54) SUPPORT FOR MICROELECTRONIC, MICROOPTOELECTRONIC OR MICROMECHANICAL DEVICES

(75) Inventor: Marco Amiotti, Milan (IT)

(73) Assignee: Saes Getter S.p.A., Milan (IT)

(21) Appl. No.: 12/150,287

(22) Filed: Apr. 24, 2008

Related U.S. Patent Documents

Reissue of:
(64) Patent No.: 6,897,551
Issued: May 24, 2005
Appl. No.: 10/201,657
Filed: Jul. 19, 2002

(30) Foreign Application Priority Data

Jul. 20, 2001 (IT) ..... MI2001A1558
Apr. 3, 2002 (IT) ..... MI2002A0688

(51) Int. Cl.
*H01L 23/20* (2006.01)

(52) U.S. Cl.
USPC .. 257/682; 228/124.6; 313/495; 257/E21.499

(58) Field of Classification Search
USPC ..... 257/682, 704, 692; 228/124.6; 313/553, 313/495, 496, 422
See application file for complete search history.

(56) References Cited

U.S. PATENT DOCUMENTS

| | | | |
|---|---|---|---|
| 3,214,381 | A | 10/1965 | Baldauf et al. |
| 4,630,095 | A | 12/1986 | Otsuka et al. |
| 4,907,974 | A | 3/1990 | Gotoh et al. |
| 5,032,461 | A | 7/1991 | Shaw et al. |
| 5,083,466 | A | 1/1992 | Holm-Kennedy et al. |
| 5,108,026 | A | 4/1992 | Su et al. |
| 5,192,240 | A | 3/1993 | Komatsu |
| 5,395,650 | A | 3/1995 | Holl et al. |
| 5,411,918 | A | 5/1995 | Keible et al. |
| 5,520,563 | A | 5/1996 | Wallace et al. |
| 5,599,749 | A | 2/1997 | Hattori |
| 5,614,785 | A | 3/1997 | Wallace et al. |
| 5,656,889 | A | 8/1997 | Niiyama et al. |
| 5,760,433 | A | 6/1998 | Ramer et al. |
| 5,760,461 | A | 6/1998 | Cronin et al. |
| 5,835,991 | A | 11/1998 | Niiyama et al. |

(Continued)

FOREIGN PATENT DOCUMENTS

| | | |
|---|---|---|
| EP | 0720260 | 7/1996 |
| EP | 0 837 502 A1 | 4/1998 |

(Continued)

OTHER PUBLICATIONS

ISR from PCT/IT02/00465.

(Continued)

*Primary Examiner* — Roy K Potter
(74) *Attorney, Agent, or Firm* — TIPS Group

(57) ABSTRACT

The specification teaches a device for use in the manufacturing of microelectronic, microoptoelectronic or micromechanical devices (microdevices) in which a contaminant absorption layer improves the life and operation of the microdevice. In a preferred embodiment the invention includes a mechanical supporting base, and discrete deposits of gas absorbing or contaminant removing material on the base by a variety of techniques and a layer for temporary protection of the contaminant removing material on top of the contaminant removing material. Passages are created in the layer which expose the contaminant removing material to atmosphere. The device may be used as a covering for the microdevice as well.

30 Claims, 5 Drawing Sheets

U.S. PATENT DOCUMENTS

| | | | | |
|---|---|---|---|---|
| 5,837,935 | A | 11/1998 | Carper | |
| 5,866,978 | A | 2/1999 | Jones et al. | |
| 5,882,727 | A | 3/1999 | Corazza et al. | |
| 5,895,233 | A | 4/1999 | Higashi | |
| 5,921,461 | A * | 7/1999 | Kennedy et al. | 228/124.6 |
| 5,961,362 | A | 10/1999 | Chalamala et al. | |
| 5,961,750 | A | 10/1999 | Boffito et al. | |
| 6,499,354 | B1 * | 12/2002 | Najafi et al. | 73/723 |
| 6,534,850 | B2 | 3/2003 | Liebeskind | |
| 6,589,599 | B1 | 7/2003 | Conte et al. | |
| 6,843,936 | B1 | 1/2005 | Jacobs | |
| 6,897,551 | B2 | 5/2005 | Amiotti | |
| 6,923,625 | B2 * | 8/2005 | Sparks | 417/48 |
| 2003/0085438 | A1 | 5/2003 | Habibi et al. | |
| 2003/0138656 | A1 | 7/2003 | Sparks | |
| 2005/0158914 | A1 | 7/2005 | Amiotti | |

FOREIGN PATENT DOCUMENTS

| | | |
|---|---|---|
| EP | 0 837 502 A2 | 4/1998 |
| JP | 09-306920 | 11/1997 |
| JP | 11040761 | 2/1999 |
| JP | 10-188460 | 1/2000 |
| WO | WO 00/61832 | 10/2000 |

OTHER PUBLICATIONS

H. Henmi, "Vacuum Packaging for Micro Sensors by Glass-Silicon Anodic Bonding", Sensors and Actuators A, 43 (1994), 243-248.

R. Ramesham, "Commercial-Off-the-Shelf Microelectromechanical Systems", Abstract, Jet Propulsion Laboratory, California Institute of Technology.

R.R. Livingston, Evaluation of H2 Getter Materials for Use in the Trupact-II, By R.R. Livingston et al, WSRC-TR-99-00160, Sep. 1999.

Request for Inter Partes Reexamination, Attachment to Form PTO-1465. (Drafted by a third party but never filed).

Saes settles MEMS Patent Suit with IMT.

Saes settles Patent Suit with IMT.

*Saes Getters S.p.A. et al.* v. *Innovative Micro Technology, Inc.*, Case No. CV 07-2632 PA (SSx) (1) Answer to Complaint and Affirmative Defenses; (2) Counterclaims for Declaratory Relief, Unfair Competition, Intentional Interference with Contractual Relations, Intentional Interference with Prospective Economic Relations, and Defamation; and (3) Demand for Jury Trial.

*Saes Getters S.p.A. et al.* v. *Innovative Micro Technology, Inc.*, Case No. CV 07-2632 PA (SSx) (C.D. Cal.) Claims of U.S. Patent No. 6,897,551 v. Prior Art References, provided by defendant.

*Saes Getters S.p.A.,* v. *Innovative Micro Technology, Inc.*, Defendant's Claim Constructions and Invalidity Contentions, with Exhibits.

*Saes Getters S.p.A. et al.* v. *Innovative Micro Technology, Inc.*, Case No. CV 07-2632 PA (SSx) Exhibits A through M.

*Saes Getters S.p.A.,* v. *Innovative Micro Technology, Inc.*, Plaintiffs' Claims Construction and Infringement Contentions (Public Version).

*Saes Getters S.p.A. et al.* v. *Innovative Micro Technology, Inc.*, Case No. CV 07-2632 PA (SSx) Stipulation of Dismissal with Prejudice; and Order.

Sheppard Mullin Letter to Counsel.

T. Corman, "Low Pressure Encapsulation Techniques for Silicon Resonators", Royal Institute of Technology, Stockholm, 1998.

(Vabond) Deliverable D 1.3, Nov. 12, 2002, Project No. IST-2001-34224, Long-term stability of vacuum-encapsulated MEMS devices using eutectic wafer bonding.

(Vabond) Deliverable Report, Deliverable No. D 6.4, Project No. IST-2001-34224, Long-term stability of vacuum-encapsulated MEMS devices using eutectic wafer bonding.

(Vabond) Deliverable report, Deliverable D3.7, Project No. IST-2001-34224, Long-term stability of vacuum-encapsulated MEMS devices using eutectic wafer bonding.

(Vabond) Deliverable Report, Deliverable D 2.2 dated Nov. 12, 2002, Project No. IST-2001-34224, Long-term stability of vacuum-encapsulated MEMS devices using eutectic wafer bonding.

(Vabond) Project presentation for publication, IST, Long-term stability for vacuum-encapsulated MEMS devices using eutectic wafer bonding, Proposal No. IST-2001-34224.

Notice of Reasons for Rejection, Patent Application No. 2003-514571, Drafting Date : Feb. 8, 2010.

International Search Report.

* cited by examiner

SUPPORT FOR MICROELECTRONIC, MICROOPTOELECTRONIC OR MICROMECHANICAL DEVICES

Matter enclosed in heavy brackets [ ] appears in the original patent but forms no part of this reissue specification; matter printed in italics indicates the additions made by reissue.

[REFERENCE TO RELATED DOCUMENTS]

[This Patent Application is related to co-pending U.S. patent application Ser. No. 10/211,426, filed Jul. 19, 2002, entitled SUPPORT WITH INTEGRATED DEPOSIT OF GAS ABSORBING MATERIAL FOR MANUFACTURING MICROELECTRONIC, MICROOPTOELECTRONIC OR MICROMECHANICAL DEVICES, which is hereby incorporated by reference in its entirety for all purposes,this application claims priority under 35 U.S.C. 119 to Italian Applications MI-2001-A-001558, file Jul. 20, 2001 and MI-2002-A-000688 filed Apr. 3, 2002, both of which are incorporated by reference in their entirety for all purposes.]

*CROSS-REFERENCES TO RELATED APPLICATIONS*

*This application is a reissue of U.S. Pat. No. 6,897,551, which claims priority to Italian Application No. MI-2001-A-001558, filed Jul. 20, 2001, and Italian Application No. MI-2002-A-000688, filed Apr. 3, 2002, both of which are incorporated by reference in their entirety. U.S. application Ser. No. 10/211,426, filed Jul. 19, 2002, is hereby incorporated by reference in its entirety.*

BACKGROUND

The present invention relates to a support for manufacturing microelectronic, microoptoelectronic or micromechanical devices with integrated deposit of gas absorbing material.

Microelectronic devices (also called integrated electronic circuits, or ICs) are the base of the integrated electronics industry. Microoptoelectronic devices comprise, for example, new generations of infrared radiation (IR) sensors which, unlike traditional ones, do not require cryogenic temperatures for their operation. These IR sensors are formed of an array of semiconductor material deposits, for example silicon, arranged in an evacuated chamber. Micromechanical devices (better known in the field under the definition "micromachines" or referred herein as MMs) are being developed for applications such as miniaturized sensors or actuators. Typical examples of micromachines are microaccelerometers, which are used as sensors to activate automobile airbags; micromotors, having gears and sprocket wheels of the size of a few microns (μm); or optic switches, wherein a mirror surface on the order of a few tens microns can be moved between two different positions, directing a light beam along two different directions, one corresponding to the "on" condition and the other to the "off" condition of an optical circuit. In the following description, these devices will also all be referred to within the general definition of solid-state devices.

ICs are manufactured by depositing layers of material with different electric (or magnetic) functionalities on a planar then selectively removing them to create the device. The same techniques of depositions and selective removal create microoptoelectronic or micromechanical devices as well.

These devices are generally contained in housings formed, in their turn, with the same techniques. The support most commonly used in these productions is a silicon "slice" (usually referred to as a "wafer"), about 1 mm thick and with a diameter up to 30 cm. On each of these wafers a very high number of devices may be constructed. At the end of the manufacturing process individual devices, in the case of micromachines, or parts, in the case of IR sensors, are separated from the slices using mechanical or laser means.

The deposition steps are carried out with such techniques as, for example, chemical deposition from vapor state, ("Chemical Vapor Deposition" or "CVD") and physical deposition from vapor state ("Physical Vapor Deposition" or "PVD"). The latter is commonly known in the art as "sputtering." Generally, selective removals are carried out through chemical or physical attacks using proper masking techniques. Such techniques are well-known in the field and will not be discussed here except as they relate specifically to the invention.

The integrated circuits and the micromachines are then encapsulated in polymeric, metallic or ceramic materials, essentially for mechanical protection, before being put to final use (within a computer, an automobile, etc.). In contract, IR radiation sensors are generally encapsualted in a chamber, facing one wall thereof, transparent to the IR radiation and known as a "window.".

In certain integrated circuits it is important to be able to control the gas diffusion in solid state devices. For example, in the case of ferroelectric memories, hydrogen diffuses through the device layers and can reach the ferroelectric material, which is generally a ceramic oxide, such as lead titanate-zirconate, strontium-bismuth tantalate or titanate, or bismuth-lanthanum titanate. When the hydrogen reaches the ferroelectric material, it can alter its correct functioning.

Still more important is gas control and elimination in IR sensors and in micromachines. In the case of IR sensors, the gases which may be present in the chamber can either absorb part of the radiation or transport heat by convection from the window to the array of silicon deposits, altering the correct measurement. In the case of micromachines, the mechanical friction between gas molecules and the moving part, due to the very small size of the latter, can lead to detectable deviations from the device's ideal operation. Moreover, polar molecules such as water can cause adhesion between the moving part and other parts, such as the support, thus causing the device's failure. In the IR sensors with arrays of silicon deposit or in the micromachines, it is therefore fundamental to ensure the housing remains in vacuum for the whole device life.

In order to minimize the contaminating gas in these devices, their production is usually conducted in vacuum chambers and pumping steps are performed before the packaging. However,the problem is not completely solved by pumping because the same materials which form the divices can release gases, or gases can permeate from outside during the device life.

To remove the gases entering in solid state devices during their life the use of materials that can sorb these destructive gases may be helpful. These absorptive materials are commonly referred to as "getters," and are generally metals such as zirconium, titanium, vanadium, niobium or tantalum, or alloys thereof combined with other transition elements, rare earths or aluminum. Such materials have a strong chemical affinity towards gases such as hydrogen, oxygen, water, carbon oxides and in some cases nitrogen. The absorptive materials also include the drier materials, which are specifically used for moisture absorption, which usually include the oxides of alkali or alkaline-earth metals. The use of materials for absorbing gases, particularly hydrogen, in ICs, is described for instance in U.S. Pat. No. 5,760,433 by Ramer et al. Ramer teaches that the chemically reactive getter material is formed as part of the process of fabricating the integrated circuit. The use of getters in IR sensors is described in U.S. Pat. No. 5,921,461 by Kennedy et al. Kennedy teaches that a getter is deposited onto preselected regions of the interior of the package. Finally, the use of gas absorbing materials in micromachines is described in the article "Vacuum packaging for microsensors by glass-silicon anodic bonding" by H. Henmi et al., published in the technical journal Sensors and Actuators A, vol. 43 (1994), at pages 243-248.

The above references teach that localized deposits of gas absorbing materials can be obtained by CVD or sputtering during solid-state device production steps. However, this procedure can be costly and time consuming if done during the solid-state manufacturing CVD or sputtering process. This is because gas absorbing material deposition during device production implies the step involved in localized deposition of the gas absorbing or getter material. This is generally carried out through the steps of resin deposition, resin local sensitization through exposure to radiation (generally UV), selective removal of the photosensitized resin, gas absorbing material deposition and subsequent removal of the resin and of the absorbing material thereon deposed, leaving the gas absorbing material deposit in the area in which the photosensitized resin had been removed. Moreover, depositing the gas absorbing material in the production line is disadvantageous because there are an increased number of steps required in the manufacturing process. increasing deposits, in turn, requires that more materials be used, which also significantly increases the risk of "cross-contamination" among the different chambers in which the different steps are carried out. Also, there is a possible increase of waste products because of contamination.

SUMMARY

The present invention solves some of the above-described problems of the prior art and, in particular, simplifies the manufacturing process for solid-state devices. The present invention includes a device for use in and process for manufacturing microelectronic, microoptoelectronic or micromechanical devices (herein also referred to as 'microdevices' or 'solid-state devices') with an integrated deposit of gas absorbing or purification material. In one embodiment, the invention is formed of a base which can function as a mechanical backing, a continuous or discontinuous deposit of a gas absorbing material on a surface of the base, and a covering said gas absorbing material deposit, made of a material compatible with the production of microelectronic, microoptoelectronic or micromechanical devices or parts thereof.

The invention shares many of the same manufacturing properties as standard silicon wafers or other semiconductor materials and therefore can be used in many of the same manufacturing processes as these materials.

BRIEF DESCRIPTION OF THE DRAWINGS

The invention will be described below with reference to the drawings in which.

DETAILED DESCRIPTION

Figure 1:
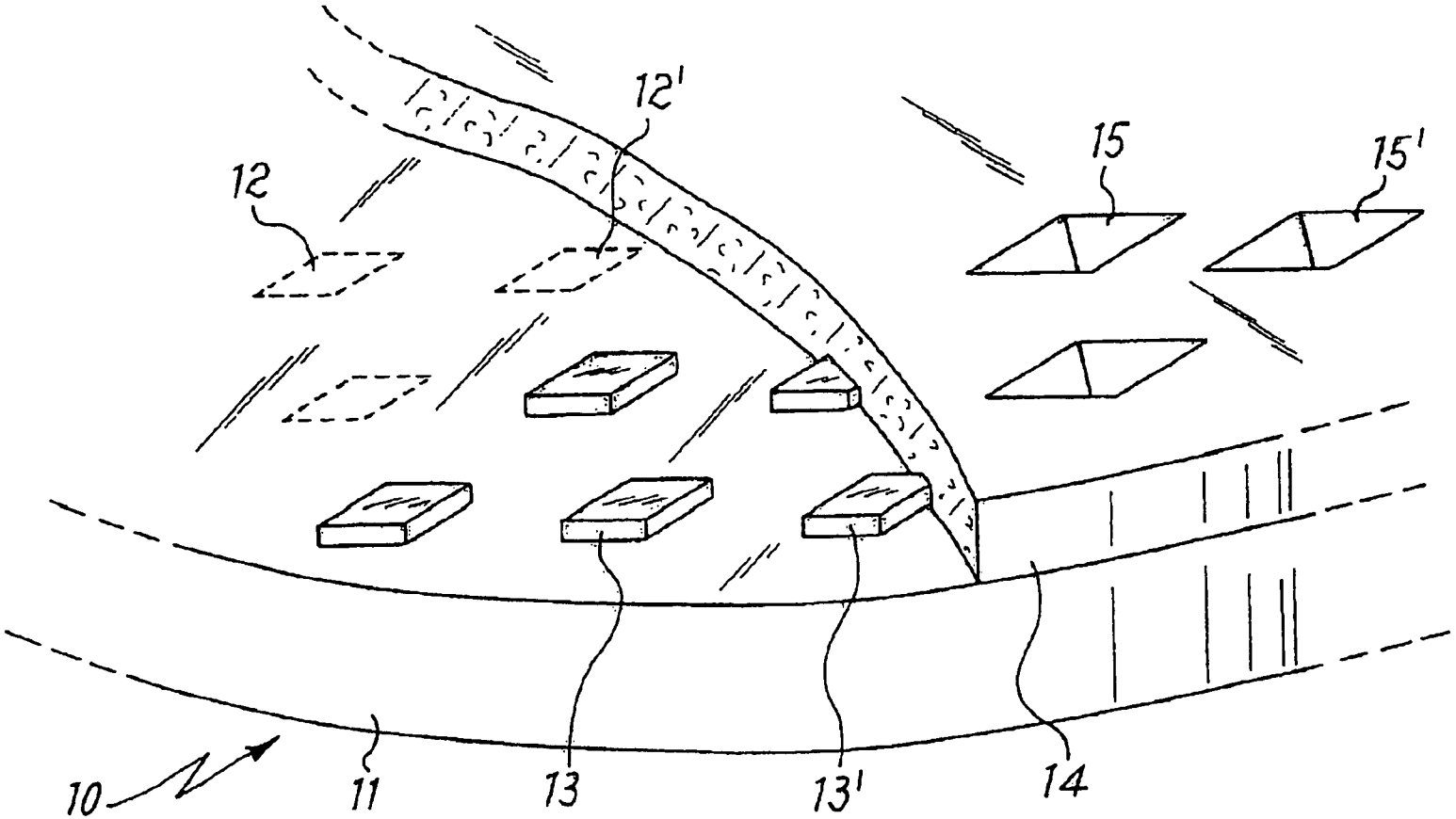
FIG. 1 shows in perspective, partially in section, a first embodiment of the invention.

For the sake of description clarity, in the drawings height-diameter ratio of supports of the invention and lateral dimensions of the gas absorbing material deposits upon the base are exaggerated with respect to real dimensions. Moreover, in the drawings, supports are always represented with a wafer geometry, that is a low disk of material, because this is the geometry commonly adopted by the producers of solid state devices, but this geometry could be also different, for example square or rectangular.

In FIG. 1 is shown a partial sectional view of a support 10 according to a first embodiment of the invention. Said support, 10, comprises a base, 11, having the only function of backing the support and devices deriving therefrom, and constitutes nearly the whole thickness of support 10 (within the range of millimeters). Base material can be a metal, a ceramic, a glass or a semiconductor, preferably silicon.

In areas 12, 12', . . . , of the surface of base layer 11, discrete deposits 13, 13', . . . of a contaminant removing material (also referred to as gas absorbing material) are obtained. Then these deposits are covered with a layer 14 of a material compatible with ICs or MMs production process. The covering layer 14 can act as the anchor for layers subsequently deposed thereon to construct ICs, microoptoelectronic devices or MMs. In a preferred embodiment the covering layer can be even itself a layer in which these devices are constructed (for example the moving parts of micromachines can be obtained in this layer by removing parts of it). Moreover the final device's soldering can be possibly made directly on the edge of covering layer 14.

Figure 2:
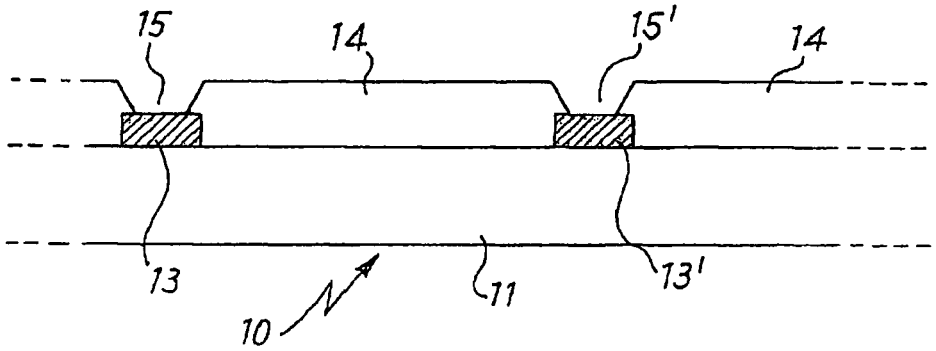
FIG. 2 shows a sectional view of the support in FIG. 1.

As shown in FIG. 2, in covering layer 14, in correspondence of deposits 13, 13', . . . , are realized passages 15, 15', . . . , having the possible function of exposing the gas absorbing or contaminant removing material 13, 13', . . . to the atmospheric environment of the support 10. Passages 15, 15', . . . , can be made by selective removal of covering layer 14 upon deposits 13, 13', . . . , through removing techniques that are known by those skilled in the art.

The gas absorbing material utilized for deposits 13, 13', . . . can be any material free from the phenomenon of lost (or losing) particles, chosen among materials commonly called getter materials, which are capable of absorbing various gas molecules, and drier materials, which are specifically used for the absorption of water vapor.

In one embodiment of the invention a getter material may be used as a contaminant removing material. The getter material can be a metal such as Zr, Ti, Nb, Ta, V; an alloy of these metals or one or more of these elements and additional element(s), preferably chosen from Cr, Mn, Fe, Co, Ni, Al, Y, La and rare-earths, like binary alloys Ti—V, Zr—V, Zr—Fe and Zr—Ni, ternary alloys like Zr—Mn—Fe or Zr—V—Fe, or alloys with more components. In a preferred embodiment of the invention, getter materials are titanium, zirconium, the alloy of weight percentage composition Zr 84%-Al 16%, produced and sold by the Applicant under the trade name St 101®, the alloy of weight percentage composition Zr 70%-V 24.6%-Fe 5.4%, produced and sold by the Applicant under the trade name St 707® and the alloy of weight percentage composition Zr 80.8%-Co 14.2%-TR 5% (wherein TR stands for a rare-earth, yttrium, lanthanum or mixtures thereof), produced and sold by the Applicant under the trade name St 787®. In case the getter material is not completely free of the "lost particles" phenomenon, it can be properly treated so as to reduce or eliminate this phenomenon, through a partial sintering or annealing treatment or other techniques which are appreciated by those skilled in the art.

In another embodiment of the invention, drier materials are used for the contaminant-removing material 13, 13', . . . . In the case of the drier materials, these are preferably chosen from among the oxides of alkali or alkaline-earth metals. Calcium oxide, CaO, is used in a preferred embodiment, because it does not pose safety or environmental problems during production, use or disposal of devices containing it. An oxide layer may be obtained, for instance through the so-called "reactive sputtering" technique, depositing the alkali or alkaline-earth metal under an atmosphere of a rare gas (generally argon) in which a low percentage of oxygen is present, so that the metal is converted to its oxide during deposition. These layers are generally compact and free from the problem of lost particles. In a preferred embodiment, there is only getter material, but in alternate embodiments there are getter and drier materials or just drier materials.

Deposits 13, 13', . . . , can be obtained through known techniques of selective deposition, and have thickness in the range between about 0.1 and about 5 μm: with thickness values lower than the indicated ones, gas sorption capability is excessively reduced, while with higher thickness values deposition times are extended without any real advantages on the sorption properties of the contaminant removing materials. These deposits have lateral dimensions variable within wide ranges and depend on the intended use of a completed device. For example, if utilization is expected in ICs, lateral dimension will be within the range of a few microns or less, while in the case of MMs, dimensions can be between a few tens and a couple thousand of microns.

Material constituting layer 14 is preferably one of the materials normally used as substrate in solid state devices production; it can be a so-called "III-V material" (for example, GaAs, GaN, or InP), or silicon in a preferred embodiment. Covering layer 14 can be obtained by sputtering, epitaxy, CVD or by others techniques known to those skilled in the art. It has a variable thickness, which is generally lower than about 60 μm in areas free from deposits 13, 13', . . . , and preferably within the range of about 1 to about 20 μm.

In order to help adhesion, covering layer 14 may be made from the same material as base 11. In a preferred embodiment the combination is silicon (mono- or polycrystalline) for base 11, and silicon grown by epitaxy for layer 14. However, those skilled in the are would appreciated that other materials with similar adhesion properties could be used as well and that the base and adhesion layer do not need to be made from the same material in an alternate embodiment.

The upper surface of covering layer 14 can also be treated by modifying its chemical composition, for example forming an oxide or a nitride, to allow the operations involved in device production to occur.

The invention can therefore be used in the production of solid-state devices of every kind. In completed devices which are ready for utilization or commercialization, deposits of gas absorbing material are "uncovered," that is, exposed to external atmosphere. To avoid the risk of excessive passivation and damaging of the absorbing or contaminant removing material, it is preferable to keep devices inside boxes under inert atmosphere, for instance argon or dry nitrogen, as would be appreciated by those skilled in the art.

Figure 3:
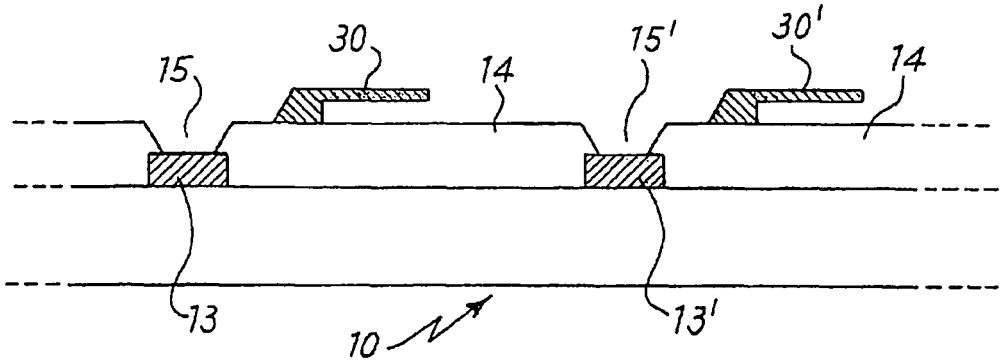
FIGS. 3-5 represent operative phases for constructing a solid-state device starting from the support of FIG. 1.
Figure 4:
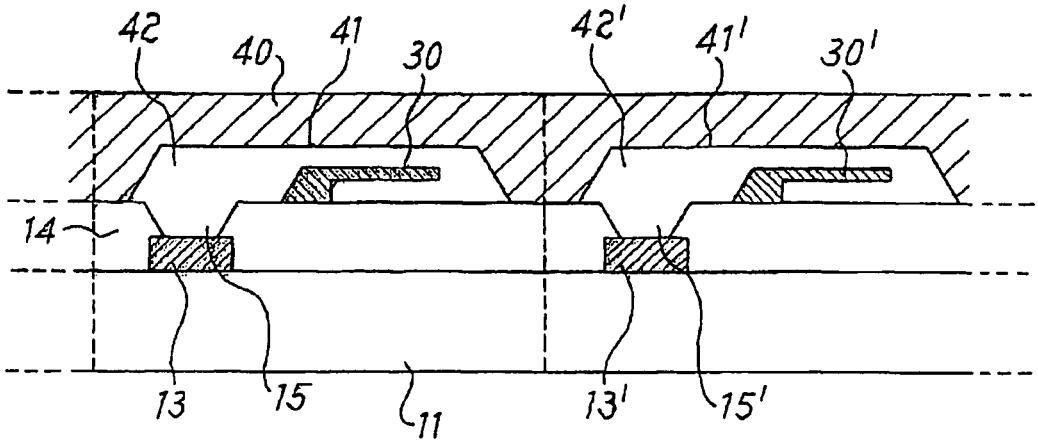
Figure 5:
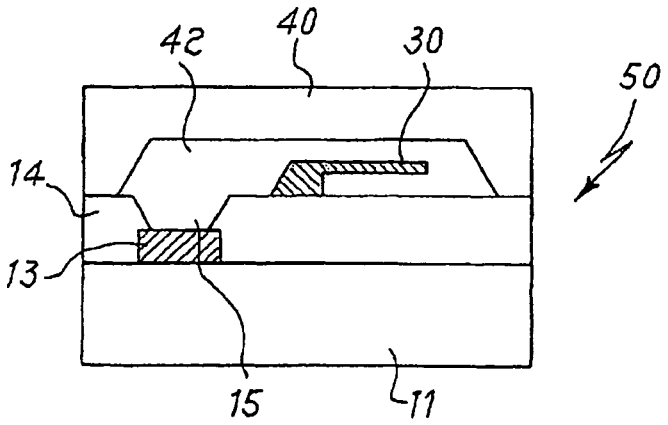

FIGS. 3-5 show a possible implementation of an embodiment of the invention, where the support 10 is used in solid-state device production, particularly micromachine production. However, the same support could be utilized for manufacturing other solid-state devices, such as integrated circuits or miniature IR sensors.

Upon areas of surface of layer 14 generally those not containing the passages 15, 15', . . . , structures can be manufactured comprising micromachine mobile parts, labeled as elements 30, 30', . . . in FIG. 3. When the production for structures 30, 30', . . . (including contacts for outside electric connection of every single micromachine, not shown in the drawing) is finished, a covering element 40 is placed over support 10, as shown in section in FIG. 4. This covering element 40 is generally constructed with the same materials as the base 11 and it is preferably easily fixable to layer 14, however the materials used for the element, base and layer can differ. Silicon is used in a preferred embodiment. The covering element 40 can have holes, 41, 41', . . . , in correspondence with areas wherein, on support 10, structures 30, 30', . . . , are located and deposits 13, 13', . . . , of gas absorbing material are exposed. In particular each of said holes will be so wide that, when support 10 and covering element 40 are fixed together, a space 42, 42', . . . , results wherein a structure like 30, 30', . . . , and a passage 15, 15', . . . , giving access to the gas absorbing material, are contained, so that the latter structures can be in direct contact with space 42, 42', . . . , and is able to sorb gas possibly present or released during time in said space. Finally, single micromachines, such as the one represented in FIG. 5, are produced by cutting the combination of support 10 and covering element 40 along their adhesion areas.

Figure 6:
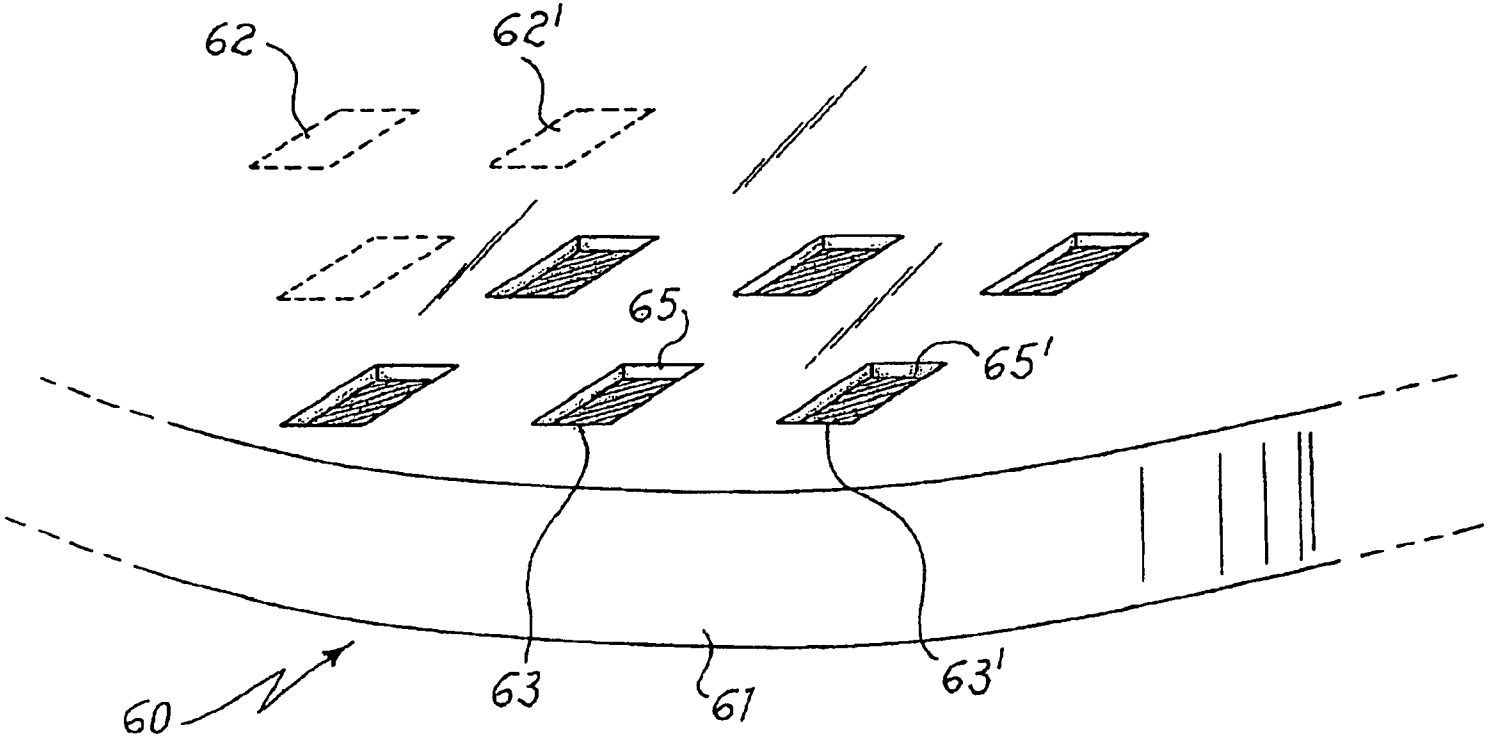
FIG. 6 shows in perspective, partially in section, a second possible support according to the invention.
Figure 7:
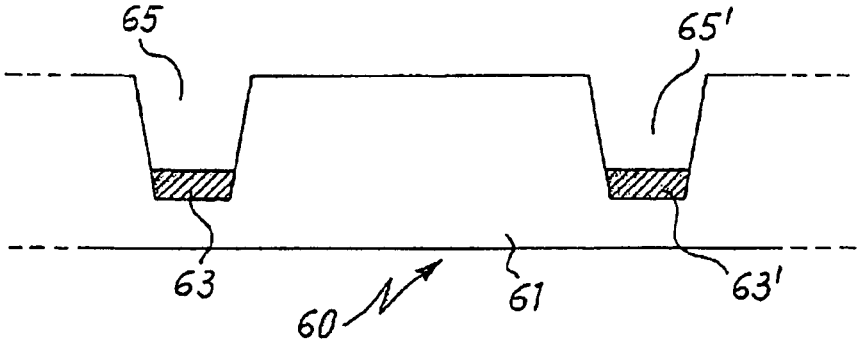
FIG. 7 shows a sectional view of support in FIG. 6.

FIGS. 6 and 7 show, partially in section, a second possible embodiment of the invention. Also in this embodiment the support 60 includes a base 61 of the same kind and dimensions of base 11 previously described, but in which hollows 65, 65', . . . , are created in localized areas 62, 62', . . . , and fitted to contain gas absorbing material deposits 63, 63', . . . . Because of the hollows configuration, the base 61 in this embodiment can substitute for the assembly made up of base 11 and layer 14 in the embodiment described above.

Figure 8:
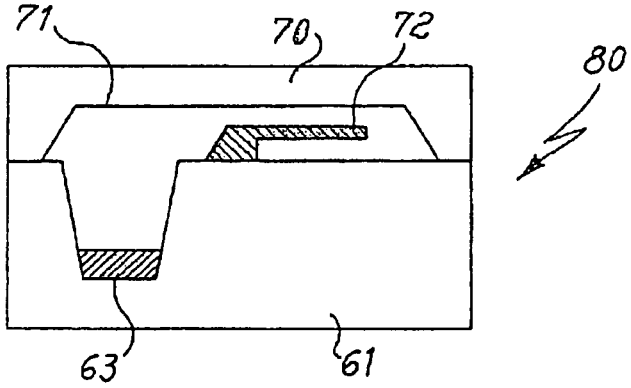
FIG. 8 represents a solid-state device obtainable from support of FIG. 6.

FIG. 8 represents a solid-state device 80, in particular a micromachine, which can be produced from the support of an alternate embodiment of the invention 60 of FIGS. 6 and 7, through a process similar to the one described with reference to FIGS. 3-5. This solid-state device 80 utilizes a covering element 70 provided with holes 71, 71', . . . , in correspondence with areas wherein, on support 60, structures 72, 72', . . . , are disposed and gas absorbing material deposits 63, 63', . . . , are exposed.

Figure 9:
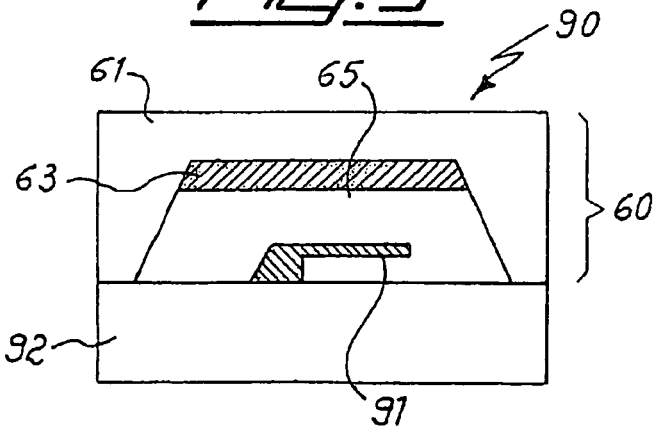
FIG. 9 shows a sectional view of another solid state-device constructed starting from the support of FIG. 6.

In another alternate embodiment as shown in FIG. 9 micromachine 90 uses the support 60 as a covering element of a solid-state device instead of as base. In this embodiment, the base on which micromachine is constructed is a traditional one as is known by those skilled in the art, without gas absorbing material deposits. The hollow 65 obtained inside base 61, thus forms a space for housing the mobile structure 91 and, at the same time, creates the passage 64) giving access to gas absorbing material.

The invention is applicable to microdevices or solid-state devices of any type which can benefit from an internally deposed gettering layer as defined by the invention. A microdevice or solid-state device can be any microelectronic, microoptoelectronic, or micromechanical device. However, any small-scale device which requires purification for contaminants which passes through channels cut into the substrate layer, which allow deposits of contaminant removing material to capture the contaminants will benefit from the scope and spirit of the invention and the invention should not be limited to only the three types of applications recited, but rather be defined by the claims below.

We claim:

1. A device for use in manufacturing, comprising a base, wherein said base functions as mechanical support for said device, wherein said device is configured such that on said base a contaminant removing material is deposed in the form of discrete deposits, wherein said discrete deposits are configured to be at least partially exposed to the atmospheric environment of said device *and wherein said discrete deposits of contaminant removing material have a thickness within a range from 0.1 to 5 μm*.

2. The device as recited in claim 1, wherein said device is used in the manufacture of a microdevice selected from the group consisting of: microelectronic devices (IC), micromechanical devices (MM), and microoptoelectronic devices, wherein said microoptoelectronic devices include IR sensors.

3. A device for use in manufacturing, comprising a base, wherein said base functions as mechanical support for said device, said device characterized in that on said base a contaminant removing material is deposed in the form of discrete deposits *have a thickness within a range from 0.1 to 5 μm*, wherein said base is covered with a layer of a material compatible with the production of microelectronic or micromechanical devices or parts thereof, said layer including passages which allow contact between the atmospheric environment of said device and said contaminant removing material.

4. A device for use in manufacture of solid state devices comprising a base, where said base comprises discrete deposits of a contaminant removing material *having a thickness within a range from 0.1 to 5 μm,* where said contaminant removing material is entirely exposed to the atmospheric environment of said device.

5. The device as recited in claim 4, said base further comprising a layer of material compatible with the production of microelectronic or micromechanical devices or parts thereof, said layer comprising passages which allow contact between the atmospheric environment of said device and said contaminant removing material.

6. The device as recited in claim 1, said base further comprising a layer of a material compatible with the production of microelectronic or micromechanical devices or parts thereof, said layer comprising passages which allow contact between said deposits and said atmospheric environment.

7. The device as recited, in claim 1, wherein said base is configured with one or more hollows wherein said one or more hollows are fitted to comprise said discrete deposits of contaminant removing material.

8. The device as recited in claim 1 wherein said base includes material selected from the group consisting of: metals, ceramics, glass, and semiconductors.

9. The device as recited in claim 8, wherein said material is silicon.

10. The device as recited in claim 1 wherein said contaminant removing material is a getter material.

11. The device as recited in claim 10 wherein said getter material includes a material selected from the group of metals consisting of: Zr, Ti, Nb, Ta, V, and alloys of these metals.

12. The device as recited in claim 11 wherein said getter material further comprises a material selected from the group consisting of: Cr, Mn, Fe, Co, Ni, Al, Y, La and rare-earths.

13. The device as recited in claim 11 characterized in that said getter material is titanium.

14. The device as recited in claim 11 wherein said getter material is zirconium.

15. The device as recited in claim 11 wherein said getter material is an alloy having a weight percentage composition Zr 84%-Al 16%.

16. The device as recited in claim 11 wherein said getter material is an alloy having a weight percentage composition Zr 70%-V 24.6%-Fe 5.4%.

17. The device as recited in claim 11 wherein said getter material is an alloy having a weight percentage composition Zr 80.8%-Co 14.2%-TR 5%, wherein TR is selected from the group consisting of: rare earths, yttrium, lanthanum and mixtures thereof.

18. The device as recited in claim 1, wherein said contaminant removing material is a drier material.

19. The device as recited in claim 18 wherein said drier material is chosen among the oxides of alkali or alkaline-earth metals.

20. The device as recited in claim 19 wherein said drier material is calcium oxide.

[21. The device as recited in claim 1, wherein said discrete deposits of contaminant removing material have a thickness within a range from 0.1 to 5 μm.]

22. The device recited in claim 3 wherein said material compatible with production of microelectronic, microoptoelectronic or micromechanical devices or parts thereof is a semiconductor material.

23. The device recited in claim 22 wherein said material is silicon.

24. The device recited in claim 3 wherein said layer of material compatible with production of microelectronic, microoptoelectronic or micromechanical devices or parts thereof have a thickness within a range from 1 to 20μm.

25. A microdevice in which the device for use in manufacturing recited in claim 1 is used as covering element in the production of a micromechanical device.

26. A device for use in the manufacture of a microdevice comprising:

mechanical support means;

contaminant removal means *having a thickness within a range from 0.1 to 5 μm* deposed on said mechanical support means; and cover means for said mechanical support means, wherein said cover means is configured with passage means, such that contaminant removal means is exposed to atmosphere through said passage means.

27. A microdevice manufacturing device, comprising:

a base;

a gas absorbing material coupled to the base *having a thickness within a range from 0.1 to 5 μm*; *and* a production process-compatible layer, covering the gas absorbing material, having a plurality of passages realized therein, wherein said passages facilitate atmospheric exposure to the gas absorbing material.

28. The device of claim 27, wherein said gas absorbing material is discretely deposited, and wherein said passages are realized over the discrete deposits.

29. The device of claim 27, wherein said production process-compatible layer adheres to said base.

30. The device of claim 27, wherein said production process-compatible layer acts as an anchor for a microdevice constructed thereon.

31. The device of claim 27, wherein a microdevice is constructed in said production process-compatible layer.

* * * * *